(12) United States Patent
Saito et al.

(10) Patent No.: US 9,029,853 B2
(45) Date of Patent: May 12, 2015

(54) DISPLAY DEVICE

(71) Applicant: Kabushiki Kaisha Toshiba, Tokyo (JP)

(72) Inventors: Nobuyoshi Saito, Tokyo (JP);
Tomomasa Ueda, Kanagawa-ken (JP);
Toshiya Yonehara, Kanagawa-ken (JP);
Hajime Yamaguchi, Kanagawa-ken (JP);
Kentaro Miura, Kanagawa-ken (JP);
Shintaro Nakano, Kanagawa-ken (JP);
Tatsunori Sakano, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1 day.

(21) Appl. No.: 13/783,718

(22) Filed: Mar. 4, 2013

(65) Prior Publication Data

US 2014/0077204 A1    Mar. 20, 2014

(30) Foreign Application Priority Data

Sep. 19, 2012    (JP) ................. 2012-206091

(51) Int. Cl.
*H01L 29/10*    (2006.01)
*H01L 29/12*    (2006.01)
(Continued)

(52) U.S. Cl.
CPC ........ *H01L 33/0041* (2013.01); *H01L 29/7869* (2013.01); *H01L 51/5265* (2013.01); *H01L 27/3276* (2013.01); *H01L 27/1225* (2013.01)

(58) Field of Classification Search
CPC . H01L 33/0041; H01L 29/7869; H05B 33/26
USPC ............... 257/43, 59, 72, E51.019, E51.021; 313/483, 491, 500, 503, 506; 345/39, 345/46, 82, 204–206, 211; 438/22, 29
See application file for complete search history.

(56) References Cited

U.S. PATENT DOCUMENTS

2003/0002002 A1\* 1/2003 Kawachi et al. ............... 349/143
2003/0201447 A1\* 10/2003 Yamazaki et al. ............... 257/79
(Continued)

FOREIGN PATENT DOCUMENTS

JP    2004-191627 A    7/2004
JP    2007-200908 A    8/2007
(Continued)

OTHER PUBLICATIONS

Office Action issued Jul. 17, 2014 in Japanese Patent Application No. 2012-206091 (with English language translation).
(Continued)

*Primary Examiner* — Meiya Li
*Assistant Examiner* — Peter M Albrecht
(74) *Attorney, Agent, or Firm* — Oblon, McClelland, Maier & Neustadt, L.L.P.

(57) ABSTRACT

According to one embodiment, a display device includes a first insulating layer, a second insulating layer, a pixel electrode, a light emitting layer, an opposite electrode and a pixel circuit. The second insulating layer is provided on the first insulating layer. The pixel electrode is provided on the second insulating layer and light-transmissive. The light emitting layer is provided on the pixel electrode. The opposite electrode is provided on the light emitting layer. The circuit is provided between the first insulating layer and the second insulating layer, includes an interconnect supplied with a drive current, and is configured to supply the drive current to the pixel electrode. The circuit is connected to the pixel electrode. The interconnect has a first region overlaying the pixel electrode when projected onto a plane parallel to the first insulating layer. The interconnect has an opening in the first region.

20 Claims, 7 Drawing Sheets

(51) Int. Cl.
*H01L 33/00* (2010.01)
*H01L 29/786* (2006.01)
*H01L 51/52* (2006.01)
*H01L 27/32* (2006.01)
*H01L 27/12* (2006.01)

(56) References Cited

U.S. PATENT DOCUMENTS

| | | | |
|---|---|---|---|
| 2004/0113544 A1* | 6/2004 | Murakami et al. | 313/504 |
| 2005/0116620 A1* | 6/2005 | Kobayashi | 313/503 |
| 2005/0168142 A1 | 8/2005 | Murakami et al. | |
| 2006/0220582 A1 | 10/2006 | Murakami et al. | |
| 2008/0001544 A1 | 1/2008 | Murakami et al. | |
| 2009/0250695 A1* | 10/2009 | Tanaka et al. | 257/43 |
| 2011/0204369 A1 | 8/2011 | Ha et al. | |

FOREIGN PATENT DOCUMENTS

| | | |
|---|---|---|
| JP | 2010-32643 | 2/2010 |
| JP | 2010-108851 | 5/2010 |
| JP | 2011-171278 A | 9/2011 |

OTHER PUBLICATIONS

Korean Office Action issued Feb. 27, 2014 in Patent Application No. 10-2013-27279 with English Translation.
Office Action issued Dec. 4, 2014 in Japanese Patent Application No. 2012-206091 (with English language translation).

* cited by examiner

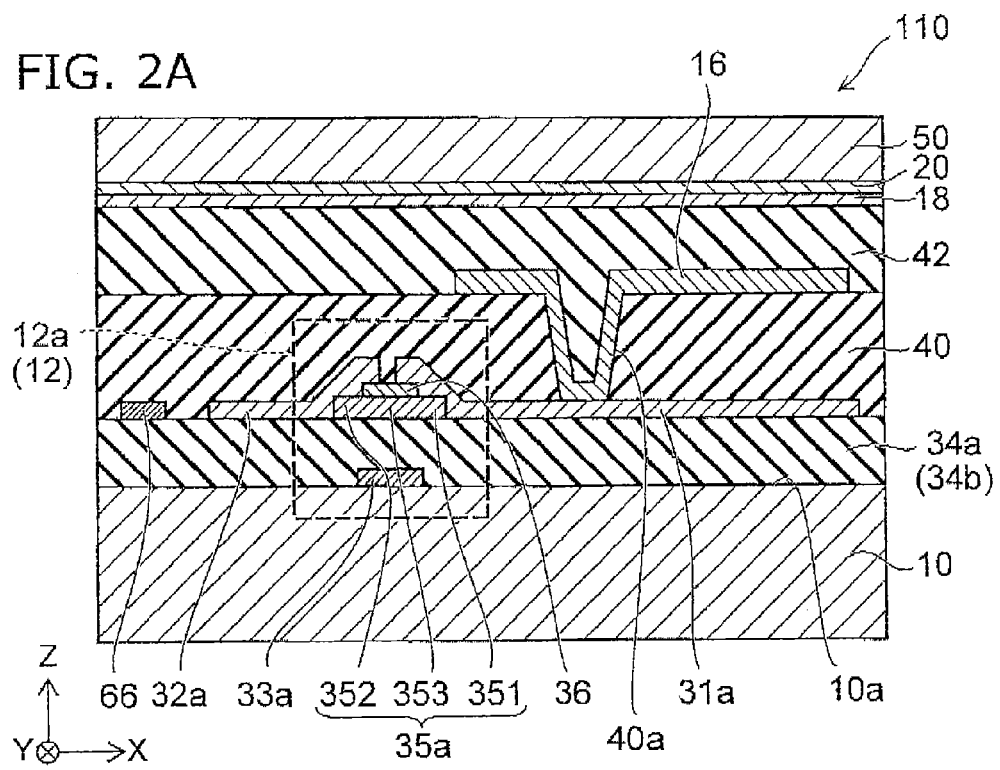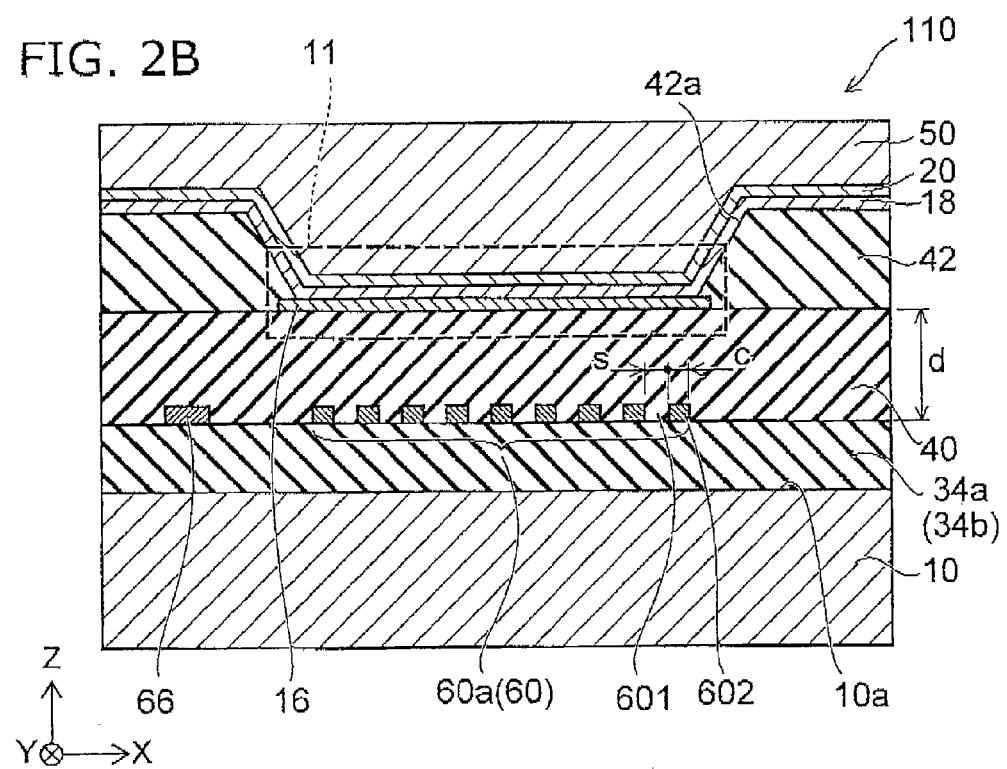

US 9,029,853 B2

DISPLAY DEVICE

CROSS-REFERENCE TO RELATED APPLICATIONS

This application is based upon and claims the benefit of priority from the prior Japanese Patent Application No. 2012-206091, filed on Sep. 19, 2012; the entire contents of which are incorporated herein by reference.

FIELD

Embodiments described herein relate generally to a display device.

BACKGROUND

Methods for driving the pixels of a display device include an active matrix method that uses switching elements such as thin film transistors, etc. For example, in a display device using an organic EL (Electro-Luminescence) element, the current flowing in the organic EL element is controlled by the switching element. It is desirable to increase the light extraction efficiency of such a display device.

BRIEF DESCRIPTION OF THE DRAWINGS

FIGS. 2A and 2B are schematic cross-sectional views showing the configuration of the display device according to the first embodiment;

DETAILED DESCRIPTION

Figure 1:
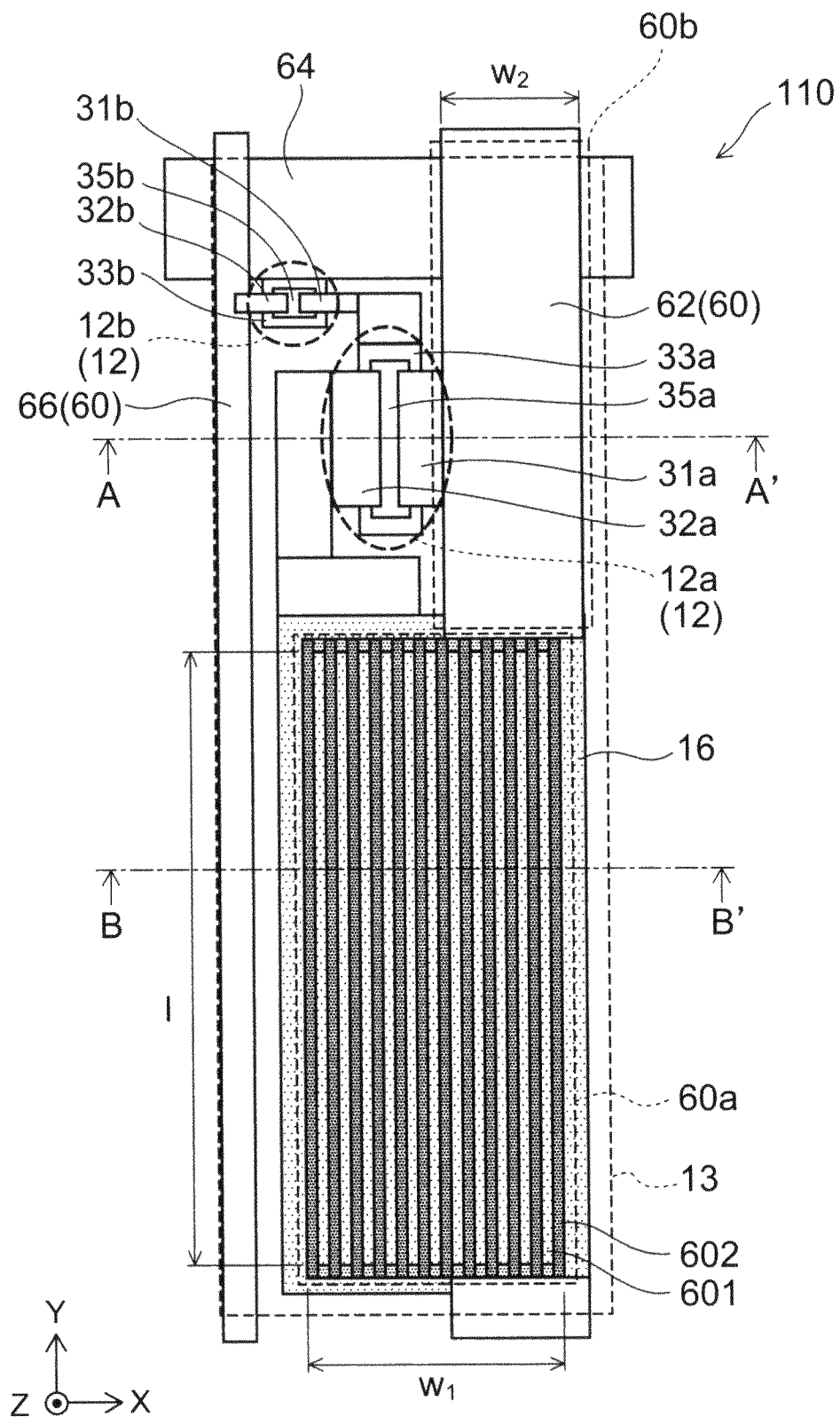
FIG. 1 is a schematic plan view showing a part of a display device according to a first embodiment.

According to one embodiment, a display device, includes a first insulating layer, a second insulating layer, a pixel electrode, a light emitting layer, an opposite electrode, and a pixel circuit. The second insulating layer is provided on the first insulating layer. The pixel electrode is provided on the second insulating layer. The pixel electrode is light-transmissive. The light emitting layer is provided on the pixel electrode. The opposite electrode is provided on the light emitting layer. The pixel circuit is provided between the first insulating layer and the second insulating layer. The pixel circuit includes an interconnect supplied with a drive current. The pixel circuit is configured to supply the drive current to the pixel electrode. The pixel circuit is connected to the pixel electrode. The interconnect has a first region overlaying the pixel electrode when projected onto a plane parallel to the first insulating layer. The interconnect has an opening provided inside the first region.

Various embodiments will be described hereinafter with reference to the accompanying drawings.

The drawings are schematic or conceptual; and the relationships between the thicknesses and the lengths of portions, the proportional coefficients of sizes between portions, etc., are not necessarily the same as the actual values thereof. Further, the dimensions and/or the proportional coefficients may be illustrated differently between the drawings, even for identical portions.

In the drawings and the specification of the application, components similar to those described in regard to a drawing thereinabove are marked with like reference numerals, and a detailed description is omitted as appropriate.

First Embodiment

FIG. 1 is a schematic plan view showing the configuration of a part of a display device according to a first embodiment.

FIGS. 2A and 2B are schematic cross-sectional views showing the configuration of the display device according to the first embodiment. FIG. 2A is a cross-sectional view along line A-A' of FIG. 1; and FIG. 2B is a cross-sectional view along line B-B' of FIG. 1.

Figure 3:
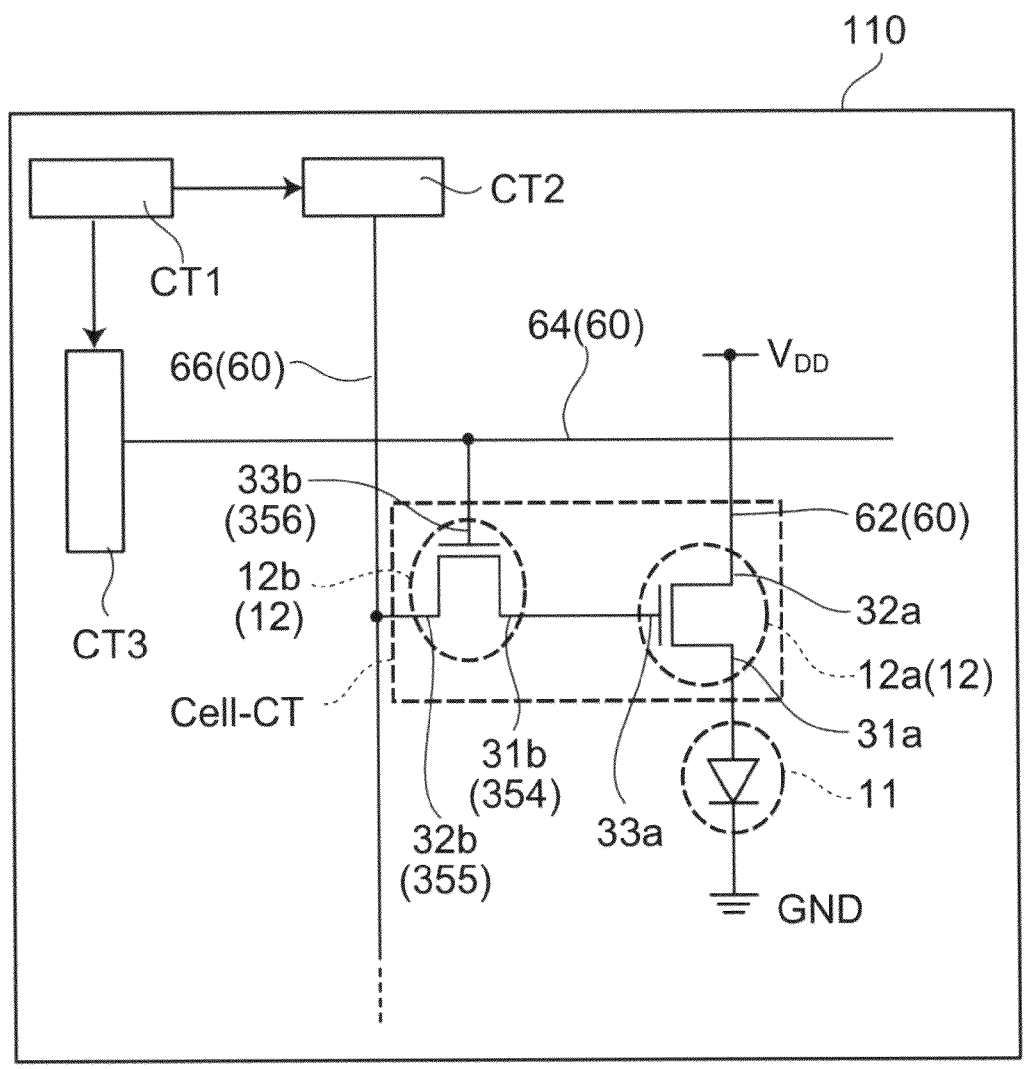
FIG. 3 is a circuit diagram showing the display device according to the first embodiment.

FIG. 3 is a circuit diagram showing the configuration of the display device according to the first embodiment.

As shown in FIG. 2A and FIG. 2B, the display device 110 according to the embodiment includes a light-transmissive substrate 10 (first insulating layer), a first gate electrode 33a provided on a first major surface 10a of the substrate 10, a first gate insulating film 34a provided on the first gate electrode 33a, a first semiconductor film 35a provided on the first gate insulating film 34a, a protection film 36 provided on the first semiconductor film 35a, and a first conductive part 31a and a second conductive part 32a provided on the first semiconductor film 35a exposing from at least the protection film.

The first semiconductor film 35a opposes the first gate electrode 33a via the first gate insulating film 34a. The first conductive part 31a opposes the second conductive part 32a via the protection film 36.

This display device 110 further includes a light transmissive insulating film 40 (second insulating layer) provided on the first conductive part 31a, the second conductive part 32a and the first gate insulating film 34a and having an opening 40a, a pixel electrode 16 provided on the insulating film 40 and connected to the first conductive part 31a exposing from the opening 40a provided on the insulating film 40, a planarization film 42 provided on the insulating film 40, a light emitting layer 18 provided on the planarization film 42, an opposite electrode 20 and a sealing film 50.

An interconnect 60 is formed on the first gate insulating film 34a as well. The interconnect 60 is covered with the insulating film 40. The first gate electrode 33a, the first gate insulating film 34a, the first semiconductor film 35a, the protection film 36, the first conductive part 31a and the second conductive part 32a constitute a first transistor 12a serving as a thin film transistor. For example, the first transistor 12a is a so called a bottom gate type thin film transistor.

The first semiconductor film 35a has a first portion 351 connected to the first conductive part 31a, a second portion 352 connected to the second conductive part 32a and a third portion 353 provided between the first portion 351 and the second portion 352. For example, the first conductive part 31a is a source electrode and the second conductive part 32a is a drain electrode. For example, the first portion 351 is a source region of the first semiconductor film 35a, and the second portion 352 is a drain region of the first semiconductor film 35a.

The first gate electrode 33a opposes the third portion 353 via the first gate insulating film 34a. The first gate insulating film 34a is provided between the first semiconductor film 35a and the first gate electrode 33a. The display device 110 is a light emitting display device including multiple light emitting elements 11.

The interconnect 60 includes a control line 64, a signal line 66 and a power supply line 62 described later. The interconnect 60 supplies a drive current to the light emitting element 11.

A normal direction with respect to a first surface 10a of the substrate 10 is taken as a "Z direction". The direction upward from the substrate 10 is the "+Z direction". The direction downward from the substrate 10 is the "−Z direction". A first direction parallel to the substrate 10 is taken as a "Y direction". A second direction parallel to the substrate 10 and perpendicular to the first direction is taken as an "X direction". In FIG. 1, the first gate insulating film 34a is provided over the whole surface.

An example of the circuit of the display device 110 according to the embodiment will now be described with reference to FIG. 3.

FIG. 3 shows an example of the equivalent circuit of one pixel of the display device 110.

FIG. 3 shows the display device 110 including a controller CT1, a signal line drive circuit CT2, a control line drive circuit CT3, and one pixel connected to the signal line drive circuit CT2 and the control line drive circuit CT3.

Although omitted in FIG. 3, the pixel is formed in a matrix configuration. The power supply line 62 and the signal line 66 extend in the Y direction. The control line 64 extends in the X direction. The pixel electrode 16 is surrounded by the power supply line 62, the signal line 66 and the multiple control lines 64 when projected to a plane parallel to the substrate 10.

As shown in FIG. 3, one pixel includes, for example, the light emitting element 11, a pixel circuit Cell-CT including a switching element 12, and the power supply line 62. The pixel circuit Cell-CT connects the power supply line 62, the control line 64, the signal line 66 and the pixel electrode 16 of the light emitting element 11, and controls the drive current supplied to the pixel electrode 16.

The light emitting element 11 is, for example, a light emitting diode. The light emitting element 11 is, for example, an organic EL element. The light emitting element 11 includes the pixel electrode 16, the light emitting layer 18, and the opposite electrode 20. In the embodiment, the pixel electrode 16 is taken as an anode, and the opposite electrode 20 is taken as a cathode. The cathode (opposite electrode 20) of the light emitting element 11 is grounded (connected to GND). The anode (the pixel electrode 16) of the light emitting element 11 is connected to the first portion 351 of the first transistor 12a.

The power supply line 62 is connected to a power supply voltage ($V_{DD}$).

The switching element 12 is connected to the pixel electrode 16, and controls the drive current supplied to the pixel electrode 16. For example, the switching element 12 is multiply provided. Here, the first switching transistor 12a and the second transistor 12b are used as the switching element 12. The first transistor 12a opens and closes an electrical connection between the pixel electrode 16 and the interconnect 60. The second transistor 12b is a write transistor for controlling the first transistor 12a.

The second transistor 12b is provided in the same layer as the layer provided with the first transistor 12a. The second transistor 12b, for example, has the structure similar to the first transistor 12a.

In the second transistor 12b, the gate electrode is called as a second gate electrode 33b, the gate insulating film is called as a second gate insulating film 34b, the semiconductor film is called as a second semiconductor film 35b, and the conductive part is called as a third conductive part 31b and a fourth conductive part 32b.

The second semiconductor film 35b is provided on the second gate electrode 33b via the second gate insulating film 34b. The second semiconductor film 35b has a fourth portion 354 connected to the third conductive part 31b, a fifth portion 355 connected to the fourth conductive part 32b and a sixth portion provided between the fourth portion 354 and the fifth portion 355.

The second gate electrode 33b is provided at a position opposing the sixth portion. The second gate electrode 33b opposes the sixth portion 356 via the second gate insulating film 34b. For example, the third conductive part 31b is a source electrode, and the fourth conductive part 32b is a drain electrode. For example, the fourth portion 354 is a source region of the second semiconductor film 35b, and the fifth portion 355 is a drain region of the second semiconductor film 35b.

The second gate insulating film 34b is provided between the second semiconductor film 35b and the second gate electrode 33b. The first gate insulating film 34a of the first transistor 12a and the second gate insulating film 34b of the second transistor 12b is one continuous film.

The first conductive part 31a of the first transistor 12a is connected to the light emitting element 11. The second conductive part 32a of the first transistor 12a is connected to the power supply line 62. The first transistor 12a is a transistor for driving the light emitting element 11. The current flowing in the light emitting element 11 is controlled by controlling the voltage of a first gate electrode 33a of the first transistor 12a.

A capacitor (not shown) may be provided between the power supply line 62 and the first gate electrode 33a of the first transistor 12a.

The third conductive part 31b of the second transistor 12b is connected to the first gate electrode 33a of the first transistor 12a. The fourth conductive part 32b of the second transistor 12b is connected to the signal line 66. The second gate electrode 33b of the second transistor 12b is connected to the control line 64.

The switching element 12 may include a transistor other than the first transistor 12a and the second transistor 12b.

One end of the control line 64 is connected to a control line drive circuit. Other ends of the control line 64 are connected to the second transistors 12b of other pixels. One end of the signal line 66 is connected to a signal line drive circuit. Other ends of the signal line 66 are connected to the second transistors 12b of other pixels.

An example of the configurations of the substrate 10 and the light emitting element 11 will now be described in more detail.

FIG. 1 illustrates one pixel 13 of the display device 110.

As shown in FIG. 1, the pixel electrode 16 is provided for each pixel 13 of the display device 110. The opposite electrode 20 described below overlays the multiple pixel electrodes 16 when projected onto an XY plane parallel to the first surface 10a of the substrate 10 (hereinbelow, called simply the plane parallel to the substrate 10). The light emitting element 11 is provided in a portion where the pixel electrode 16 overlays the opposite electrode 20 when projected onto the plane parallel to the substrate 10. In other words, the opposite electrode 20 overlays the multiple pixel electrodes 16 when viewed in plan. When viewed in plan, the light emitting element 11 is provided in the portion where the pixel electrode 16 overlays the opposite electrode 20.

As shown in FIG. 2B, the insulating film 40 is provided on the substrate 10. The substrate 10 is a light-transmissive insulating layer. The substrate 10 may be configured to include an insulating layer on a side opposing the insulating film 40. In the embodiment, "being light-transmissive" refers to being configured to transmit at least the light emitted from the light emitting layer 18 described below. The substrate 10 may include, for example, a glass substrate. The substrate 10 may include, for example, a resin material such as a polyimide resin, an aramid resin, etc. In such a case, the substrate 10 may include a base body of these glasses and resins and a barrier layer provided on the base body.

The insulating film 40 protects the switching element 12. The insulating film 40 insulates the pixel electrode 16 from the interconnect 60, etc. The insulating film 40 is insulative and light-transmissive. The insulating film 40 may include, for example, at least one of a silicon oxide film, a silicon nitride film, a silicon oxynitride film, and an aluminum oxide ($Al_2O_3$) film.

The thickness d of the insulating film 40 is, for example, not less than 0.5 micrometers (μm) and not more than 10 μm. When the thickness d of the insulating film 40 is within the range recited above, the light becomes easy to extract to the outside from an opening 601 by being diverted past a conducting portion 602 of the interconnect 60 by multiple reflections between the interconnect 60 and the opposite electrode 20. Accordingly, the light extraction efficiency in a first region 60a of the interconnect 60 increases.

As shown in FIG. 2B, the light emitting element 11 includes the pixel electrode 16, the light emitting layer 18, and the opposite electrode 20. The pixel electrode 16 is provided on the insulating film 40. The pixel electrode 16 transmits the light emitted from the light emitting layer 18. In other words, the pixel electrode 16 is light-transmissive. The pixel electrode 16 is more light-transmissive than the opposite electrode 20. The pixel electrode is, for example, a transparent electrode. The pixel electrode 16 may include an oxide including one of In, Ga, Sn, and Zn. The pixel electrode 16 is, for example, indium-tin-oxide (ITO).

A planarization film 42 is provided on the insulating film 40 and on the periphery of the pixel electrode 16. An opening 42a is provided in the planarization film 42. The pixel electrode 16 is exposed from the opening 42a of the planarization film 42. The planarization film 42 includes, for example, an organic material. The planarization film 42 may include, for example, a photosensitive acrylic resin, photosensitive polyimide, etc.

The light emitting layer 18 is provided on the pixel electrode 16 and the planarization film 42. The light emitting layer 18 includes, for example, an organic light emitting layer. The organic light emitting layer emits, for example, light of the visible region. The light emitting layer 18 may include, for example, a hole transport layer provided on the pixel electrode 16, an organic light emitting layer provided on the hole transport layer, and an electron transport layer provided on the organic light emitting layer. Instead of the hole transport layer, a hole injection layer and a layer of the hole injection layer stacked with the hole transport layer may be used. Instead of the electron injection layer, an electron injection layer and a layer of the electron injection layer stacked with the electron transport layer may be used. For example, the light emitting layer 18 may be multiply provided; and the multiple light emitting layers 18 may include a light emitting layer that emits red light, a light emitting layer that emits green light, and a light emitting layer that emits blue light.

The opposite electrode 20 is provided on the light emitting layer 18. The opposite electrode 20 may include, for example, a metal. The opposite electrode 20 includes, for example, at least one of aluminum (Al) and silver (Ag). In addition to the metals recited above, the opposite electrode 20 may include an alkaline metal or an alkaline earth metal, or a compound of an alkaline metal and an alkaline earth metal. The thickness of the opposite electrode 20 is, for example, not less than 5 nanometers (nm) and not more than 500 nm, and more favorably not less than 50 nm and not more than 200 nm.

Light is emitted from the portion of the light emitting layer 18 interposed between the pixel electrode 16 and the opposite electrode 20.

For example, the luminance of the light emitted in the downward direction from the substrate 10 is higher than the luminance of the light emitted in the upward direction from the opposite electrode 20. The light emitting element 11 is a so-called bottom-emission type. In the case where the light emitting element 11 is the bottom-emission type, the switching element 12, the interconnect 60, etc., are provided between the pixel electrode 16 and the substrate 10 as described below. The light emitted from the light emitting layer 18 is shielded by the switching element 12, the interconnect 60, etc.

A sealing layer 50 is provided on the opposite electrode 20. The sealing layer 50 suppresses the penetration of moisture and/or oxygen into the light emitting element 11. The sealing film 50 may include, for example, one of a silicon oxide film, a silicon nitride film, and a silicon oxynitride film. The sealing layer 50 may further include moisture absorbent.

An example of the power supply line 62 will now be described.

The power supply line 62 is provided between the insulating film 40 and the substrate 10.

The interconnect 60 has the first region 60a overlaying the pixel electrode 16 and the second region 60b not overlaying the pixel electrode 16 when projected onto the plane parallel to the substrate 10. The first region 60a has the opening 601. The portion of the first region 60a other than a portion (conducting portion 602) provided with the power supply line 62 is the opening 601.

The light emitted from the light emitting layer 18 that travels in the Z direction is emitted in the downward direction from the substrate 10 via the opening 601. For example, another light component of the light emitted from the light emitting layer 18 is reflected by the conducting portion 602 of the first region 60a and is further reflected by the opposite electrode 20. Thus, this light component is multiply reflected between the conducting portion 602 and the opposite electrode 20. Since the opposite electrode 20 absorbs light not a little, an intensity of light emission attenuates with repeat of reflection. When multiply reflected light reaches the opening 601 with time, the light is emitted in the downward direction from the substrate 10. By the opening 601 being provided in the first region 60a, the number of the multiple reflections is less than the case where the opening 601 is not provided. This light component is emitted in the downward direction from the substrate 10 from the opening 601 by a fewer number of multiple reflections.

In the embodiment, it is decided that the power supply line 62 has the first region 60a overlaying the pixel electrode 16 when projected to a plane parallel to the substrate 10. However, instead of the power supply line 62, other interconnects 60 (control line 64, signal line 66) may be formed like this.

A large current flows in the power supply line 62 for driving the light emitting element 11. Since it is favorable for the resistance of the power supply line 62 to be low, it is favorable for a surface area of the power supply line 62 to be increased. In the embodiment, even if increasing the surface area of the power supply line 62, by the power supply line 62 having the opening 601 provided inside the first region 60a, the light extraction efficiency increases; and the resistance of the interconnect 60 can be decreased.

A length w1 in the X direction of the power supply line 62 in the first region 60a is longer than a length w2 in the X direction of the power supply line 62 in the second region 60b. For example, the length w1 in the X direction of the power supply line 62 in the first region 60a is longer than the length w2 in the X direction of the power supply line 62 in the second region 60b by sum of length s in the X direction of multiple openings 601. Thereby, the resistance of the first region 60a does not exceed the resistance of the second region 60b.

A length 1 in the Y direction of the opening 601 is longer than the length s in the X direction of the opening 601. Thereby, the light extraction efficiency can be increased without increasing the resistance of the interconnect 60. The configuration of the interconnect is, for example, rectangular when projected to a plane parallel onto the substrate 10. The interconnect 60 has, for example, the slit-like opening 601. The configuration of the opening 601 may be square, polygonal, circular and ellipsoidal or the like.

In this example, the opening 601 is multiply provided. As described above, the power supply line 62 has the conducting portion 602 interposed between the multiple openings 601. For example, the power supply line 62 has the conducting portions of 2 or more provided inside the first region 60a. A length c in the X direction of the conducting portion 602 is, for example, not more than 5 μm.

For example, for the peak wavelength of the light emitted from the light emitting layer 18, the light transmittance of the power supply line 62 is lower than the light transmittance of the pixel electrode 16. The light emitted from the light emitting layer 18 is reflected by the power supply line 62. The power supply line 62 includes, for example, a metal.

The power supply line 62 may include, for example, multiple conductive layers stacked in the Z direction. For example, for the peak wavelength of the light emitted from the light emitting layer 18, the reflectance of the portion of the conducting portion 602 on the pixel electrode 16 side is higher than the reflectance of the portion of the conducting portion 602 on the substrate 10 side. By the reflectance of the portion of the conducting portion 602 on the pixel electrode 16 side being high, the attenuation of the light incident to the conducting portion 602 is suppressed. That is, by efficiently reflecting the light on the pixel electrode 16 side of the conducting portion 602, loss of the light is suppressed, and the light emitted downward from the substrate 10 through the opening 601 can be increased. Thereby, the extraction efficiency of the light component due to the multiple reflections increases.

The power supply line 62 extends, for example, in the Y direction parallel to the substrate 10. For example, the ratio (s/d) of the length s of the opening 601 in the X direction to the thickness d of the insulating film 40 is not less than 0.001 and not more than 10. It is more favorable for the ratio (s/d) to be not less than 0.01 and not more than 5. By the ratio (s/d) being within the ranges recited above, the light extraction efficiency due to the multiple reflections increases.

The resistivity of the material of the interconnect 60 is lower than the resistivity of the material of the pixel electrode 16. For example, the interconnect 60 includes one of Al and Ag. By the interconnect 60 including these materials, the resistance of the interconnect 60 is reduced. For example, the interconnect 60 includes a molybdenum (Mo)/Al stacked film. In such a case, the Al film is disposed between the molybdenum film and the substrate 10.

For example, the signal line 66 includes the same material as the power supply line 62 and is provided in the same layer as the interconnect 60. The signal line 66 may include a material different from the power supply line 62. For example, the signal line 66 may include a Mo/Al/Mo stacked film.

For example, the control line 64 includes the same material as the power supply line 62 and is provided between the substrate 10 and the first gate insulating film 34a. The control line 64 may include a material different from the power supply line 62. For example, the control line 64 may include a Mo/Al/Mo stacked film. For example, Mo or Ti in the upper portion of the interconnect made of Mo/Al/Mo or Ti/Al/Ti is removed by etching process in a region disposed in a portion below the pixel electrode 16, and thereby Al with higher reflectance is bared and the loss of the light due to the multiple reflections can be suppressed.

An example of the switching element 12 will now be described.

As shown in FIG. 2A, the switching element 12 is provided between the insulating film 40 and the substrate 10. The switching element 12 opens and closes the electrical connection between the pixel electrode 16 and the interconnect 60.

The first gate electrode 33a and the second gate electrode 33b include a conductive material. The first gate electrode 33a and the second gate electrode 33b may include, for example, a refractory metal such as molybdenum-tungsten (MoW), molybdenum-tantalum (MoTa), tungsten (W), etc.

The first gate insulating film 34a and the second gate insulating film 34b include an insulating material. The first gate insulating film 34a and the second gate insulating film 34b may include, for example, one of a silicon oxide film, a silicon nitride film, and a silicon oxynitride film.

A first conductive part 31a is connected to the first portion 351. A second conductive part 32a is connected to the second portion 352. The first conductive part 31a, the second conductive part 32a, the third conductive part 31b, and the fourth conductive part 32b include a conductive material, for example, include one of Ti, Mo, Al, and Ag.

The first semiconductor film 35a and the second semiconductor film 35b include, for example, an oxide semiconductor including at least one of In, Ga, and Zn. The first semiconductor film 35a and the second semiconductor film 35b include, for example, indium-gallium-zinc oxide (IGZO). The first semiconductor film is light-transmissive. The light component of the light emitted from the light emitting layer 18 that is incident on the first semiconductor film 35a is extracted to the outside by passing through the first semiconductor film 35a. Thereby, the light extraction efficiency of the display device 110 increases. The first semiconductor film 35a and the second semiconductor film 35b may include one of amorphous silicon, polycrystalline silicon, and other compound semiconductors.

In this example, a protective film 36 is provided. In the first transistor 12a, the first semiconductor film 35a is disposed between the gate insulating film 34a and the protective film 36. In the second transistor 12b, the second semiconductor film 35b is disposed between the second gate insulating film 34b and the protection film 36. Thereby, the third portion 353 is protected. The insulating material is used as the protection film 36. The protection film 36 includes, for example, one of a silicon oxide film, a silicon nitride film, and a silicon oxynitride film.

The interconnect 60 is provided in the same layer as the first semiconductor film 35a. The interconnect 60 and the first semiconductor film 35a are provided on the first gate insulating film 34a. The interconnect 60 includes the same material as the first portion 351 and the second portion 352. For example, the interconnect 60 also is formed when forming the first transistor 12a.

Next, an example of the characteristics of the display device according to the embodiment will be described.

Figure 4A:
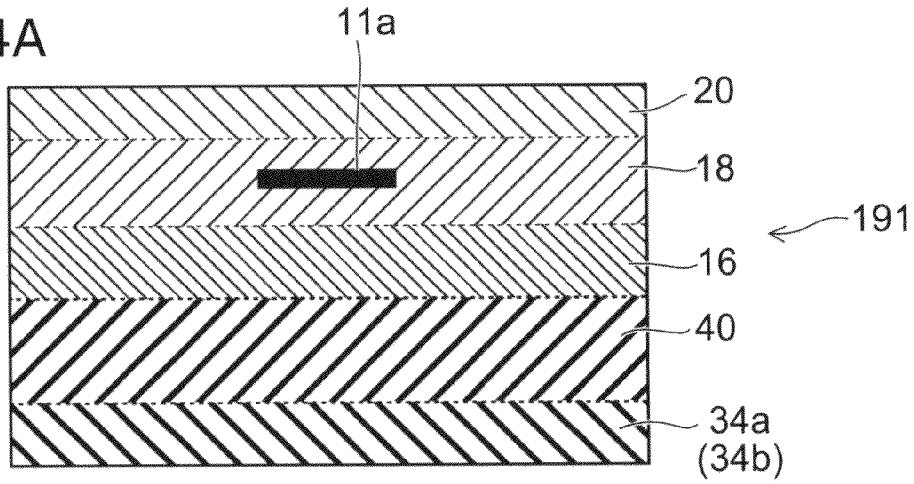
FIG. 4A to FIG. 4C are cross-sectional views of the display device of the first embodiment and display devices of reference examples.
Figure 4B:
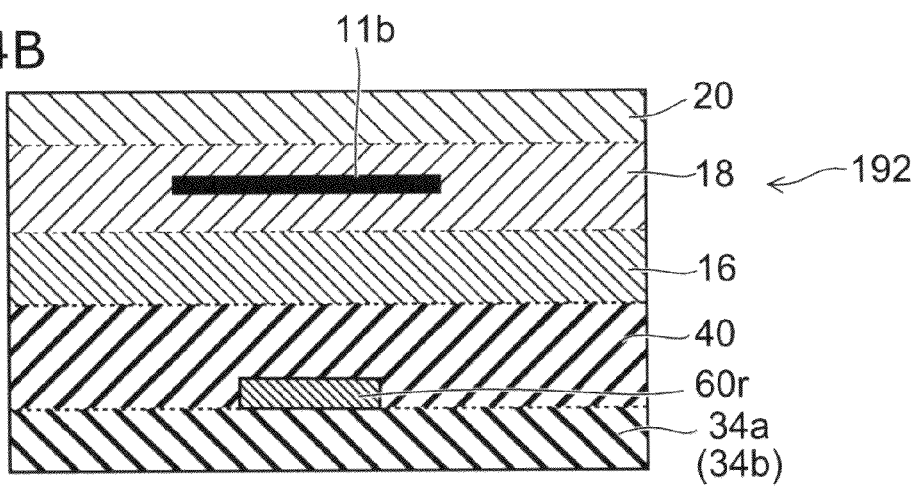
Figure 4C:
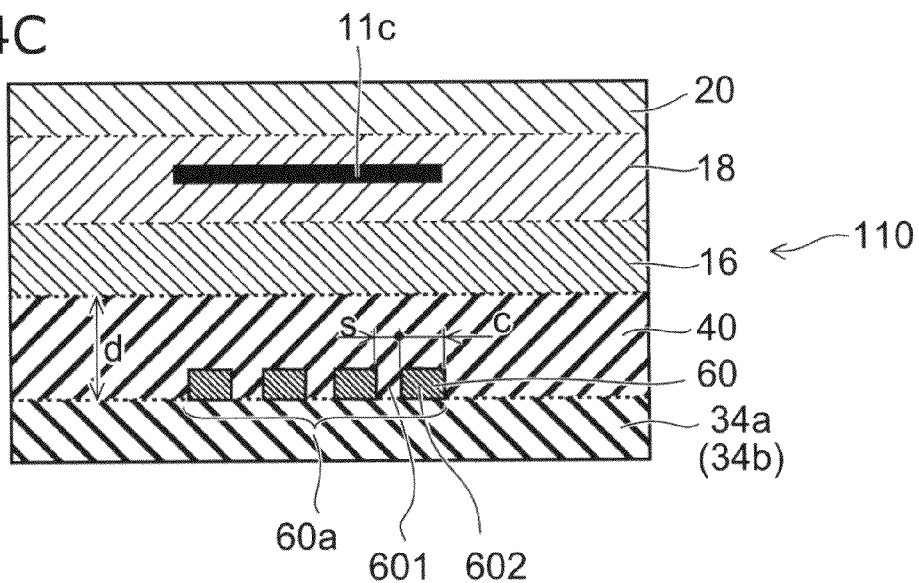

FIG. 4A to FIG. 4C are cross-sectional views of the display device of the first embodiment and display devices of reference examples.

These drawings schematically show the configurations of the display devices used in a luminance evaluation by simulation described below.

In the first embodiment and the reference examples, the thickness of the first gate insulating film 34a is 0.2 μm; the thickness d of the insulating film 40 is 3 μm; the thickness of the pixel electrode 16 is 0.05 μm; and the thickness of the light emitting layer 18 is 0.2 μm.

As shown in FIG. 4A, a display device 191 of a first reference example does not include the interconnect 60 at the position overlaying the pixel electrode 16 when projected onto the plane parallel to the substrate 10. In the display device 191 of the first reference example, the surface area of a light emitting region 11a is ½ of the surface area of a light emitting region 11b of a display device 192 of a second reference example described below.

As shown in FIG. 4B, the display device 192 of the second reference example includes an interconnect 60r provided in the first region 60a overlaying the pixel electrode 16 when projected onto the plane parallel to the substrate 10. However, in the display device 192, the interconnect 60r does not have an opening.

In the display device 110 of the embodiment as shown in FIG. 4C, the interconnect 60 has the opening 601 provided inside the first region 60a. In the display device 110, the surface area of a light emitting region 11c is twice the surface area of the light emitting region 11a of the display device 191 of the first reference example and equal to the surface area of the light emitting region 11a of the display device 192 of the second reference example.

Figure 5:
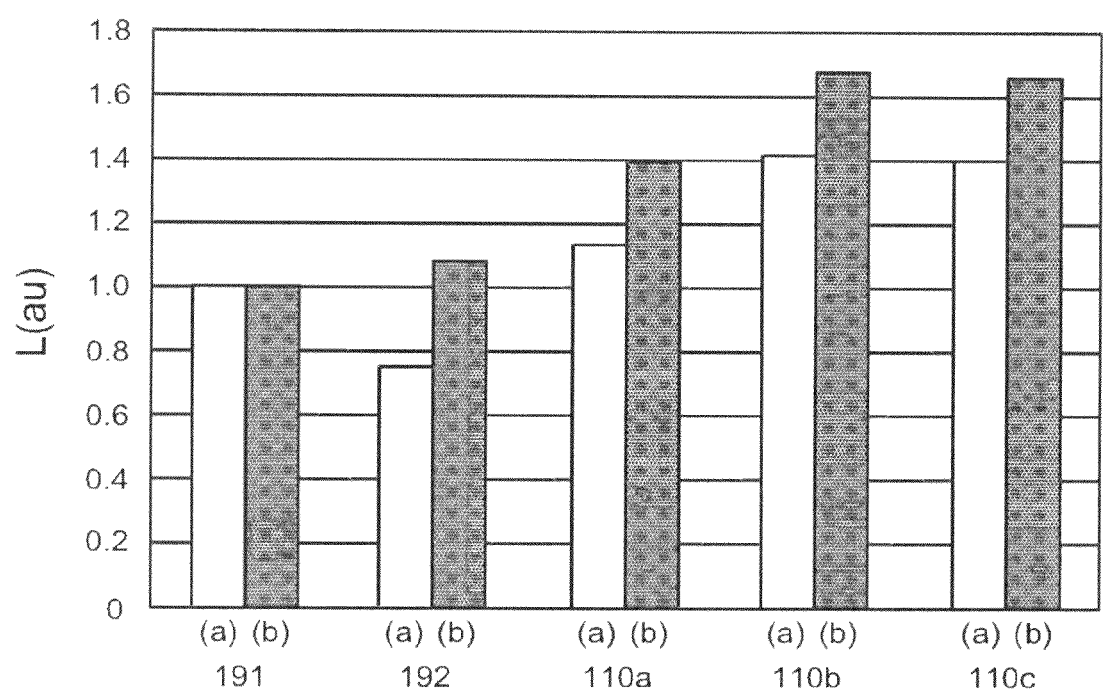
FIG. 5 shows the characteristics of the display devices of the first embodiment and the reference examples.

FIG. 5 illustrates the characteristics of the display devices of the first embodiment and the reference examples.

The vertical axis of FIG. 5 is a luminance L of the display devices for a prescribed current density. The luminance L is a normalized value such that the luminance of the display device 191 of the first reference example is 1.

On the horizontal axis of FIG. 5, (a) corresponds to the luminance of the light in the normal direction of the substrate 10; and (b) corresponds to sum of the luminance of the light in all directions.

FIG. 5 shows the characteristics of three types of display devices 110a, 110b and 110c as the display device according to the embodiment. The configuration of the opening 601 and the configuration of the conducting portion 602 are different between the three types of display devices. In the display device 110a of the first specific example, the length c of the conducting portion 602 in the X direction is 5 μm; a length s of the opening 601 in the X direction is 5 μm; and a number N of the openings 601 inside the first region 60a is 10. In the display device 110b of the second specific example, the length c is 1 μm; the length s is 1 μm; and N is 50. In the display device 110c of the third specific example, the length c is 0.5 μm; the length s is 0.5 μm; and N is 100. The total area of the opening 601 with respect to the surface area of the pixel electrode 16 is equal between these specific examples.

In the display device 192 of the second reference example, the length of the interconnect 60r in the X direction is 50 μm.

In the display device 192 of the second reference example, the luminance in the normal direction ((a)) of the substrate 10 is lower than that of the display device 191 of the first reference example. In the display device 192 of the second reference example, the light emitted from the light emitting layer 18 is shielded by the interconnect 60r. Therefore, due to the interconnect 60r, the light in the normal direction of the substrate 10 is not easily extracted to the outside.

In the display device 192 of the second reference example, the luminance in all directions ((b)) is higher than that of the display device 191 of the first reference example. It is considered that this is because the light is emitted in directions other than the normal direction of the substrate 10 due to the multiple reflections between the interconnect 60r and the opposite electrode 20. In the display device 192 of the second reference example, although the luminance of the light component in the normal direction of the substrate 10 decreases, the luminance in all directions increases. The amount of the increase of the luminance in the display device 192 of the second reference example is small due to the absorption of the light at the interconnect 60r, etc., because the number of the multiple reflections is high.

Conversely, in the display devices 110a to 110c according to the embodiment, the luminance is higher than not only the luminance of the display device 192 of the second reference example but also the luminance of the display device 191 of the first reference example in either the normal direction or all directions. In the display devices 110a to 110c, the luminance in all directions ((b)) is higher than the luminance in the normal direction ((a)) of the substrate 10. Since a broad view angle is desired for a display device, it is favorable for the display device to have high luminance in all directions.

In the embodiment, the light emitted from the light emitting layer 18 that is in the normal direction of the substrate 10 is emitted in the downward direction from the substrate 10 via the opening 601. Also, another light component of the light emitted from the light emitting layer 18 is reflected, for example, by the conducting portion 602 of the first region 60a and further reflected by the opposite electrode 20. Thus, this light component is multiply reflected between the interconnect 60 and the opposite electrode 20.

In the embodiment, the number of the multiple reflections is low because the interconnect 60 has the opening 601. The light component is emitted in the downward direction of the substrate 10 from the opening 601 by a fewer number of multiple reflections. Thereby, the luminance in the embodiment is higher than the luminance of the display device 191 of the first reference example.

Due to the light component due to the multiple reflections, the light is emitted also in directions other than the normal direction of the substrate 10. Accordingly, the luminance of the light in all directions ((b)) is higher than the luminance in the normal direction ((a)) of the substrate 10.

In the embodiment, the luminance increases and is saturated in either the normal direction or all directions in the case where the length s of the opening 601 in the X direction is short and the number N of the openings 601 is large. The luminance increases and is saturated in the case where the ratio (s/d) of the length s of the opening 601 in the X direction to the thickness of the insulating film 40 is low. The luminance of the display device 110b is higher than the luminance of the display device 110a. The luminance of the display device 110c is substantially equal to the luminance of the display device 110b.

From this trend, the ratio (s/d) of the length s of the opening 601 in the X direction to the thickness of the insulating film 40 is set to be, for example, not less than 0.001 and not more than 10. It is more favorable for the ratio (s/d) to be not less than 0.01 and not more than 5.

When the ratio (s/d) is less than 0.001, the light extraction efficiency is saturated. When the ratio (s/d) is larger than 10, the light in the normal direction of the substrate 10 is not easily extracted to the outside. When the ratio (s/d) is not less than 0.001 and not more than 10, the light extraction efficiency increases due to the multiple reflections while maintaining the patternability of the opening 601.

When the interconnect 60r is formed so as to overlay the pixel electrode 16 like the display device 191, a region transmitting the light becomes small, and thus the interconnect 60 is generally provided not so as to overlay the pixel electrode 16. In this case, since the interconnect 60 is formed with a surface area not producing too low resistance, the surface area of the pixel electrode 16 is small. When the surface area of the pixel electrode 16 is small, a surface area of the light emitting layer 18 interposed between the pixel electrode and the opposite electrode 20, namely, the surface area of the light emitting element 11 becomes small, and thus it becomes difficult to increase the luminance of the display device. Alternatively, if the surface area of the light emitting element 11 is made great by increasing the surface area of the pixel electrode 16 and the luminance of the display device is made to be increased, it results in increase of the interconnect resistance due to decrease of the surface area of the interconnect 50.

Conversely, in the embodiment, the interconnect 60 has the first region 60a overlaying the pixel electrode 16 when projected onto the plane parallel to the substrate 10. In the embodiment, the surface area of the pixel electrode 16 can be greater than that of the display device 191. Therefore, the surface area of the light emitting element 11 in the pixel 13 increases. Therefore, the surface area of the light emitting element 11 can be made great and the light emitted from the light emitting layer 18 of the light emitting element 11 can be efficiently extracted. Thereby, in the embodiment, the luminance increases.

Thus, according to the embodiment, the light extraction efficiency increases without reducing the resistance of the interconnect.

Second Embodiment

Figure 6:
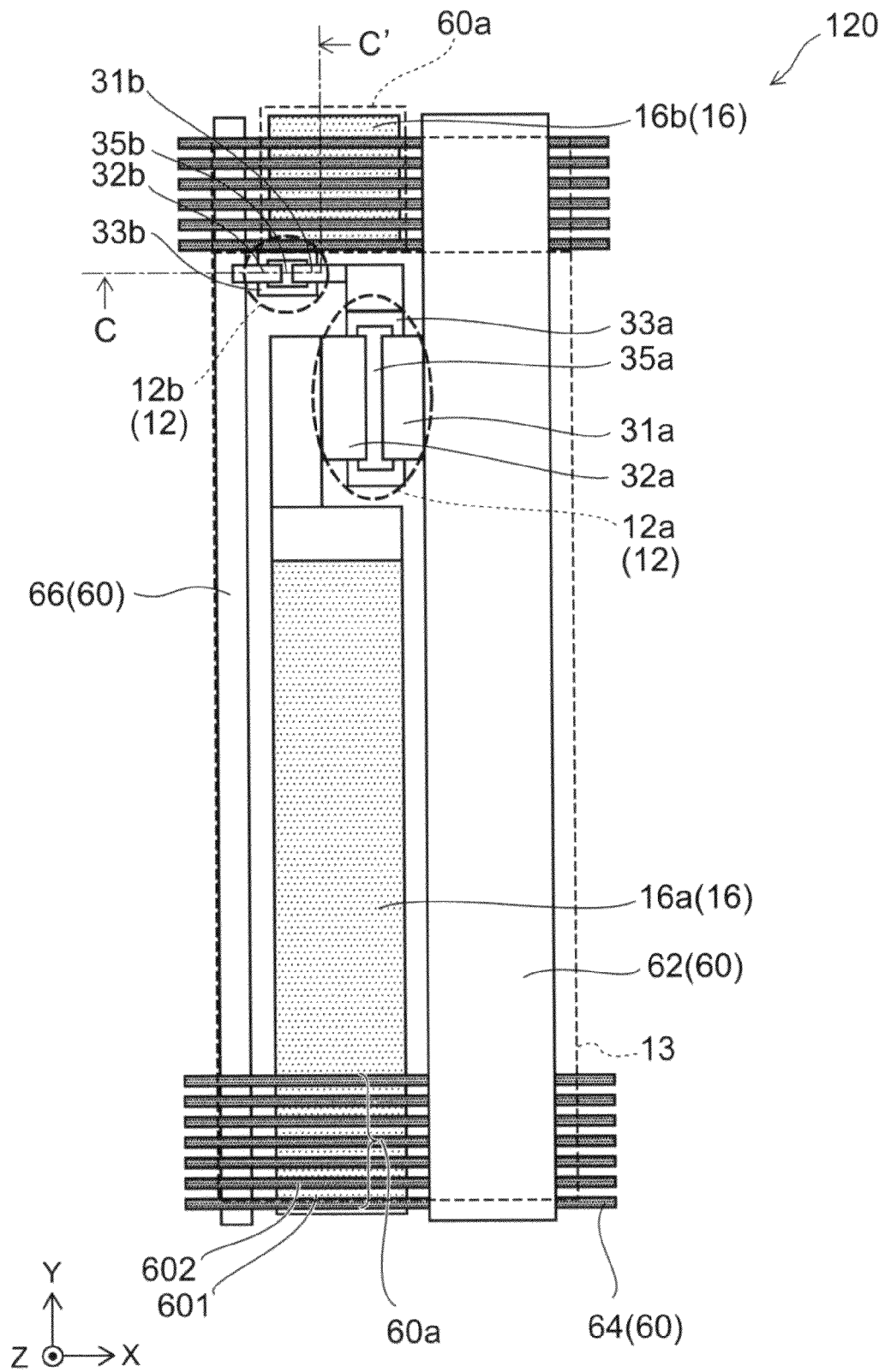
FIG. 6 is a schematic plan view showing a part of a display device according to a second embodiment.

FIG. 6 is a schematic plan view illustrating the configuration of a part of a display device according to a second embodiment.

Figure 7:
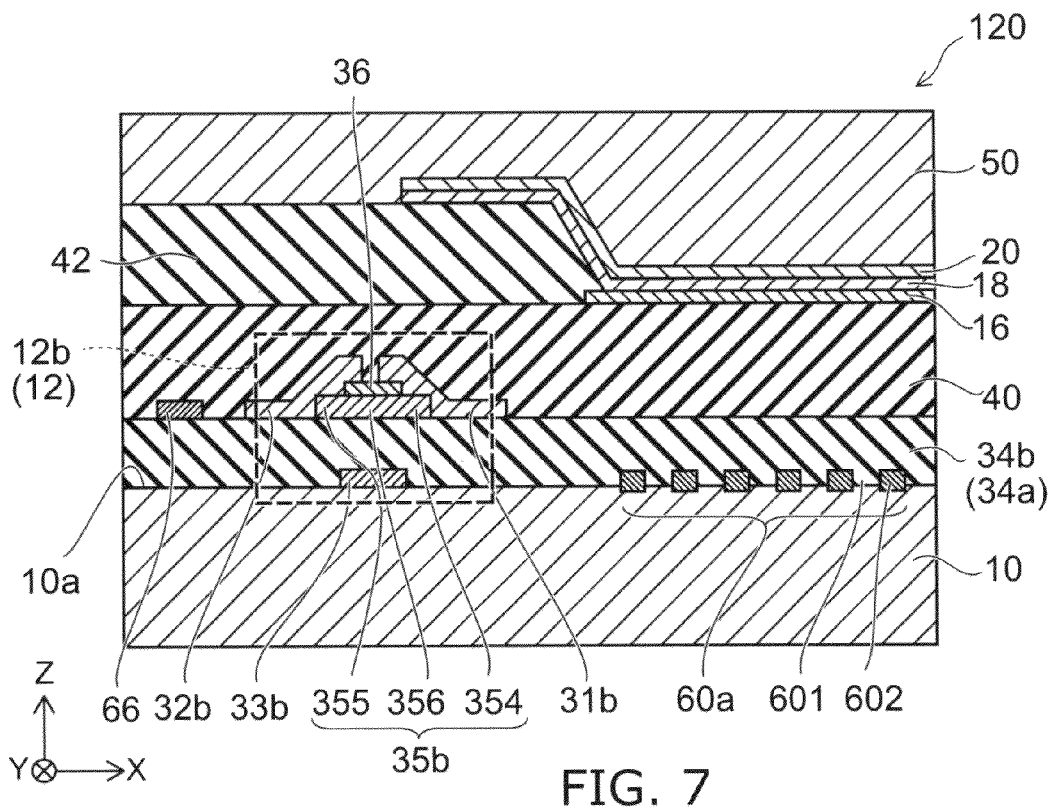
FIG. 7 is a schematic cross-sectional view showing the display device according to the second embodiment.

FIG. 7 is a schematic cross-sectional view illustrating the configuration of the display device according to the second embodiment. FIG. 7 is a cross-sectional view along line C-C' of FIG. 6.

The display device 120 according to the second embodiment differs from the display device 110 according to the first embodiment in that the interconnect 60 is the control line 64. The aspects of the display device 120 that are different from those of the display device 110 will now be described.

As shown in FIG. 6, similarly to the first embodiment, the switching element 12 includes the first transistor 12a and the second transistor 12b connected to the first transistor.

In the embodiment, the control line 64 has the first region 60a overlaying the pixel electrode 16 when projected onto the plane parallel to the substrate 10. The control line 64 extends in a first direction (the X direction) parallel to the substrate 10. In the embodiment, the first direction is a direction that is different from that of the first embodiment. Further, the power supply line 62 and the signal line 66 extend in a second direction (the Y direction) that is parallel to the substrate 10 and perpendicular to the first direction (the X direction).

The pixel electrode 16 is multiply provided. The multiple pixel electrodes 16 include a first pixel electrode 16a to which the interconnect 60 is connected via the switching element 12, and a second pixel electrode 16b that is adjacent to the first pixel electrode 16a and provided at a position different from that of the first pixel electrode 16a. The control line 64 has the first region 60a overlaying the second pixel electrode 16b when projected onto the plane parallel to the substrate 10. The first region 60a has the opening 601. The portion of the first region 60a other than a portion (conducting portion 602) provided with the control line 64 is the opening 601.

The length of the opening 601 in the X direction is longer than the length of the opening 601 in the Y direction. Thereby, the light extraction efficiency increases without increasing the resistance of the interconnect 60. The configuration of the interconnect 60 is, for example, rectangular when projected onto a plane parallel to the substrate 10. The interconnect 60 has, for example, the slit-like opening 601. The configuration of the opening 601 may be square, polygonal, circular and ellipsoidal or the like.

In this example, the opening 601 is multiply provided. As described above, the control line 64 has the conducting portion 602 interposed between the multiple openings 601. For example, the control line 64 has the conducting portions of 2 or more provided inside the first region 60a. A length c in the X direction of the conducting portion 602 is, for example, not more than 5 μm.

As shown in FIG. 7, the second transistor 12b is provided between the insulating film 40 and the substrate 10.

The control line 64 is provided in the same layer as the second gate electrode 33b. In other words, both the control line 64 and the second gate electrode 33b are provided on the substrate 10. The interconnect includes the same material as the second gate electrode 33b. For example, the control line 64 is formed simultaneously when forming the second gate electrode 33b.

In the second embodiment, an example of the control line 64 having the opening 601 has been described as the interconnect 60, however the interconnect 60 may be the signal line 66. The interconnect 60 may be multiply provided; and the multiple interconnects 60 may include the power supply line 62, the control line 64, and the signal line 66. Thus, the interconnect 60 having the first region 60a may be selected according to the disposition of the display device 120.

Third Embodiment

Figure 8:
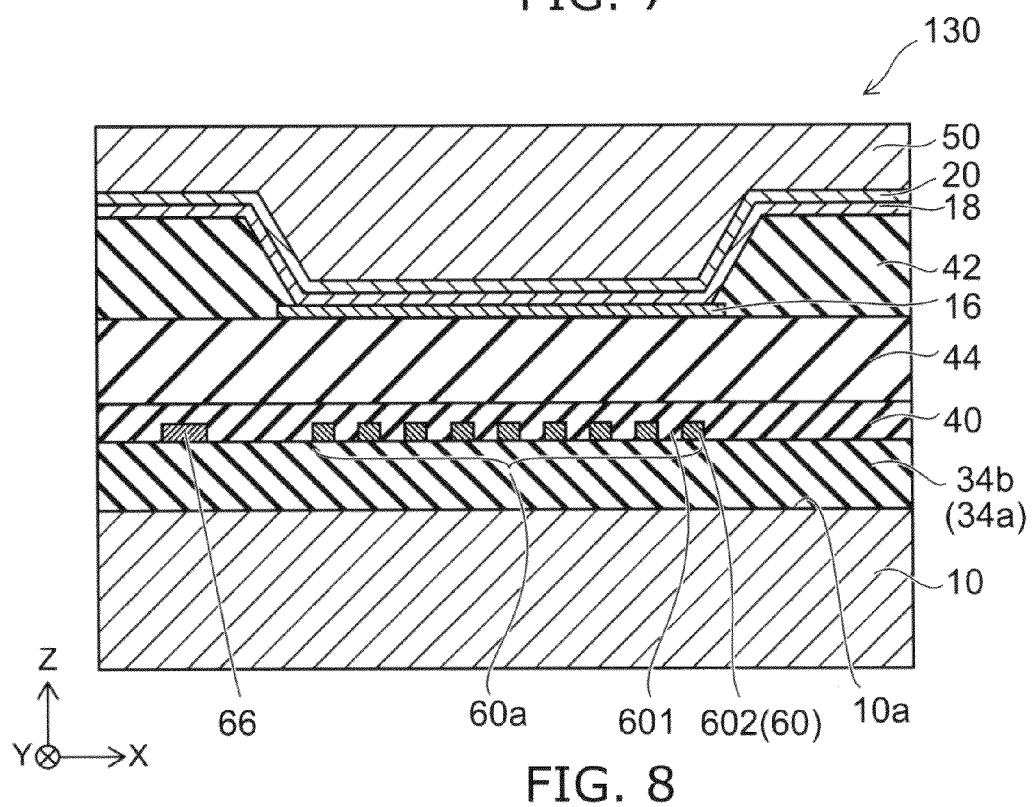
FIG. 8 is a schematic cross-sectional view showing a display device according to a third embodiment.

FIG. 8 is a schematic cross-sectional view illustrating the configuration of a display device according to a third embodiment.

The display device 130 according to the third embodiment differs from the display device 110 according to the first embodiment in that a color filter 44 is provided. The aspects of the display device 130 that are different from those of the display device 110 will now be described.

In the display device 130, the light emitting layer 18 emits, for example, white light. The light emitting layer 18 emits light having, for example, a wavelength region not less than 400 nanometers and not more than 800 nm. For example, in the CIE XYZ colorimetric system, the color coordinates of the light are not less than 0.20 and not more than 0.50 for X and not less than 0.20 and not more than 0.50 for Y. The light emitting layer 18 may include materials that emit light of a different color for each pixel.

In this example, the color filter 44 is provided between the insulating film 40 and the pixel electrode 16. The thickness of the color filter 44 is, for example, not less than 0.5 μm and not more than 5 μm. The transmittance of the color filter 44 for a first wavelength band of the light emitted from the light emitting layer 18 is higher than the transmittance of the color filter 44 for a second wavelength band that is different from the first wavelength band. For example, the pixel electrode 16 is multiply provided; and the color filter 44 is multiply provided corresponding to the pixel electrode. In the case where the pixel electrode 16 includes a first pixel electrode, a second pixel electrode and a third pixel electrode, the multiple color filters 44 include a first color filter provided in response to the first pixel electrode to transmit red light, a second color filter provided in response to the second pixel electrode to transmit green light, and a third color filter provided in response to the third pixel electrode to transmit green light. A black matrix may be provided in at least one of a region between the first color filter and the second color filter, a region between the second color filter and the third color filter, and a region between the first color filter and the third color filter.

The color of the light that is emitted is converted when the multiple reflections occur between the interconnect 60 and the opposite electrode 20. Thus, the color filter 44 may be provided in a region necessary for the multiple reflections between the insulating film 40 and the pixel electrode 16.

The color filter may be provided between the insulating film 40 and the substrate 10.

Thus, according to the embodiment, a display device having a higher light extraction efficiency is provided.

Hereinabove, exemplary embodiments of the invention are described with reference to specific examples.

However, the embodiments of the invention are not limited to these specific examples. For example, one skilled in the art may similarly practice the invention by appropriately selecting specific configurations of components included in the display device from known art; and such practice is included in the scope of the invention to the extent that similar effects are obtained.

Further, any two or more components of the specific examples may be combined within the extent of technical feasibility and are included in the scope of the invention to the extent that the purport of the invention is included.

Moreover, all display devices practicable by an appropriate design modification by one skilled in the art based on the display devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A display device, comprising:
a first insulating layer;
a second insulating layer provided on the first insulating layer;
a pixel electrode provided on the second insulating layer, the pixel electrode being light-transmissive;
a light emitting layer provided on the pixel electrode;
an opposite electrode provided on the light emitting layer; and
a pixel circuit provided between the first insulating layer and the second insulating layer, the pixel circuit including an interconnect supplied with a drive current, the pixel circuit being connected to the pixel electrode and configured to supply the drive current to the pixel electrode,
the interconnect having a first region and a second region, the first region overlaying the pixel electrode when projected onto a plane parallel to the first insulating layer, the second region not overlaying the pixel electrode when projected onto the plane, the interconnect having an opening in the first region,
the first region and the second region including a first film,
the second region further including a second film, the first film being provided between the first insulating layer and the second film in the second region, the second film not extending in the first region,
the first film including Al, and
the second film including one of Mo and Ti.

2. The device according to claim 1, wherein
the pixel circuit includes a switching element, the switching element connected to the pixel electrode and configured to control the drive current supplied to the pixel electrode.

3. The device according to claim 2, wherein
the switching element includes a first transistor provided between the first insulating layer and the second insulating layer, and
the first transistor includes
a first conductive part connected to the pixel electrode,
a second conductive part connected to the interconnect and separated from the first conductive part,
a first semiconductor film connected to the first conductive part and the second conductive part,
a first gate electrode provided at a position opposing the first semiconductor film, and
a first gate insulating film provided between the first semiconductor film and the first gate electrode.

4. The device according to claim 3, wherein
the first transistor is bottom gate type,
the first gate electrode is provided on the second insulating layer,
the first gate insulating film is provided on the first gate electrode,
the first semiconductor film is provided on the first gate insulating film, and
at least a part of the first conductive part and at least a part of the second conductive part are provided on the first semiconductor film.

5. The device according to claim 3, wherein the interconnect is provided in a same layer as a layer provided with the first conductive part.

6. The device according to claim 1, wherein the interconnect is connected to a power supply voltage.

7. The device according to claim 3, wherein
the switching element further includes a second transistor connected to the first transistor,
the second transistor includes
a third conductive part connected to the first gate electrode,
a fourth conductive part separated from the third conductive part, and
a second semiconductor film connected to the third conductive part and the fourth conductive part,
a second gate electrode opposing the second semiconductor film; and
a second gate insulating film provided between the second semiconductor film and the second gate electrode.

8. The device according to claim 7, further comprising:
a control line connected to the second gate electrode; and a signal line connected to the fourth conductive part,
the interconnect extending in a first direction parallel to the first insulating layer, the signal line extending in the first direction,
the control line extending in a second direction, the second direction being parallel to the first insulating layer and the second direction being perpendicular to the first direction.

9. The device according to claim 2, wherein
the switching element includes
a first transistor provided between the first insulating layer and the second insulating layer, and
a second transistor provided between the first insulating layer and the second insulating layer, the second transistor being connected to the first transistor,
the first transistor includes
a first conductive part connected to the pixel electrode,
a second conductive part separated from the first conductive part,
a first semiconductor film connected to the first conductive part and the second conductive part,
a first gate electrode provided at a position opposing the first semiconductor film, and
a first gate insulating film provided between the first semiconductor film and the first gate electrode, and
the second transistor includes
a third conductive part connected to the first gate electrode,
a fourth conductive part separated from the third conductive part,
a second semiconductor film connected to the third conductive part and the fourth conductive part,
a second gate electrode provided at a position opposing the second semiconductor film, the second gate electrode being connected to the interconnect, and
a second gate insulating film provided between the second semiconductor film and the second gate electrode.

10. The device according to claim 9, wherein the interconnect is provided in a same layer as a layer provided with the second gate electrode.

11. The device according to claim 9, wherein the interconnect includes a same material as a material of the second gate electrode.

12. The device according to claim 9, further comprising:
a power supply line connected to the second conductive part; and
a signal line connected to the fourth conductive part,
the interconnect extending in a first direction parallel to the first insulating layer, and
the power supply line and the signal line extending in a second direction parallel to the first insulating layer and perpendicular to the first direction.

13. The device according to claim 1, wherein
the interconnect extends in a first direction parallel to the first insulating layer,
the opening has a first length and a second length,
the first length is along the first direction,
the second length is along a second direction,
the second direction is parallel to the first insulating layer, and the first length is longer than the second length.

14. The device according to claim 13, wherein a ratio of the second length to a thickness of the second insulating layer is not less than 0.01 and not more than 5.

15. The device according to claim 13, wherein
the opening is provided in a plurality,
the interconnect has a conducting portion interposed between the plurality of openings, and
a length of the conducting portion in the second direction is not more than 5 micrometers.

16. The device according to claim 1, wherein
the interconnect extends in a first direction parallel to the first insulating layer, and
a length of the first region in a second direction is longer than a length of the second region in the second direction, and the second direction is parallel to the first insulating layer and the second direction is perpendicular to the first direction.

17. The device according to claim 1, wherein a transmittance of the interconnect for a peak wavelength of light emitted from the light emitting layer is lower than a transmittance of the pixel electrode for the peak wavelength of the light.

18. The device according to claim 1, wherein
the interconnect has a first face and a second face,
the first face faces the pixel electrode in the first region,
the second face faces the first insulating layer in the first region,
the first face has a first reflectance,
the second face has a second reflectance, and
the first reflectance is higher than the second reflectance for a peak wavelength of a light emitted from the light emitting layer.

19. The device according to claim 2, wherein the interconnect includes Al and Ag.

20. The device according to claim 2, wherein the switching element includes a semiconductor film, the semiconductor film including an oxide semiconductor, the oxide semiconductor including one of In, Ga, and Zn.

* * * * *